United States Patent [19]

Seki

[11] 4,145,666

[45] Mar. 20, 1979

[54] MULTISTAGE AMPLIFIER CIRCUIT

[75] Inventor: Kunio Seki, Tokyo, Japan

[73] Assignee: Hitachi, Ltd., Japan

[21] Appl. No.: 882,452

[22] Filed: Mar. 1, 1978

[30] Foreign Application Priority Data

May 18, 1977 [JP] Japan ............................... 52-56407

[51] Int. Cl.² .................... H03F 3/183; H03F 3/30
[52] U.S. Cl. ................................ 330/265; 330/107;
330/109; 330/271; 330/294
[58] Field of Search ............... 330/107, 109, 265, 271, 330/294, 307

[56] References Cited

PUBLICATIONS

Sample, "Design of a Monolithic Integrated-Circuit Audio-Amplifier Driver", IEEE Transactions.

Broadcast & Television Receivers, vol. BTR-18, No. 2, May 1972, pp. 65-67.

*Primary Examiner*—James B. Mullins
*Attorney, Agent, or Firm*—Craig & Antonelli

[57] ABSTRACT

A phase compensator circuit for a multistage amplifier circuit is made up of two capacitors which are connected between input and output terminals of a first amplifier circuit, and a resistor which is connected between a common juncture of the two capacitors and an output terminal of a second amplifier circuit succeeding to the first amplifier circuit. The phase compensation is carried out substantially by the two capacitors in a high frequency region, and by the resistor and the capacitor intervening between the input terminal of the first amplifier circuit and the output terminal of the second amplifier circuit in a low frequency region.

5 Claims, 2 Drawing Figures

MULTISTAGE AMPLIFIER CIRCUIT

BACKGROUND OF THE INVENTION

This invention relates to a multistage amplifier circuit.

In this specification, a circuit which includes a plurality of amplifier circuits connected in cascade and a negative feedback circuit for applying negative feedback to the plurality of amplifier circuits shall be termed a "multistage amplifier circuit."

In the multistage amplifier circuit as defined above, the amplifier circuits connected in cascade are usually subjected to phase compensation in order to stabilize the negative feedback operation.

In a power monolithic IC (semiconductor integrated circuit) as described in, for example, a catalog issued in August 1976, "HITACHI LINEAR IC's FOR ACOUSTIC EQUIPMENT," page 65, a multistage amplifier circuit is constructed of a first stage amplifier circuit for converting an input voltage signal into a current signal, a class-A driving stage amplifier circuit of comparatively high gain for amplifying the current signal, and a class-B output stage amplifier circuit. The phase compensation is carried out by disposing a phase compensating capacitor between the input and output terminals of the driving stage amplifier circuit which attains the high gain.

In the above circuit, the phase compensating capacitor provides a local negative feedback path for the class-A driving stage amplifier circuit and consequently suppresses the development of a signal distortion in the class-A driving stage amplifier circuit in a high frequency region. In the multistage amplifier circuit, however, the output stage amplifier circuit executes the class-B operation and causes a comparatively large signal distortion, and in the high frequency region, the quantity of negative feedback from the output stage amplifier circuit to the first stage amplifier circuit decreases as the result of the local feedback and it becomes impossible to satisfactorily cancel the signal distortion of the output stage amplifier circuit by the negative feedback signal, so that the distortion of an output signal increases.

On the other hand, in case where, as described on pages 130 and 131 of the aforecited catalog, a first capacitor for phase compensation is disposed between the output terminal of the output stage amplifier circuit and the input terminal of the driving stage amplifier circuit and a second capacitor is disposed between the input terminal of the driving stage amplifier circuit and the earth point of the multistage amplifier circuit, local negative feedback is applied to the output stage amplifier circuit to the amount of lowering of the open loop gain due to the first capacitor in the high frequency region, so that the increase in the distortion of the output signal ascribable to the lowering of the open loop gain is restrained. The second capacitor limits the quantity of local feedback to be executed through the first capacitor in the high frequency region, and prevents local oscillations attributed to a phase lag between the driving stage amplifier circuit and the output stage amplifier circuit.

In the above expedient, however, in order to make the open loop gain high, the second capacitor disposed on the input side of the driving stage needs to have a capacitance sufficiently higher than that of the first capacitance, for example, about 100 times higher. Therefore, when intending to construct the multistage amplifier circuit into the form of an IC, the capacitor of the great value cannot be formed within the IC and is made an externally mounted component, so that the number of external terminals of the IC increases. In addition, since the capacitor within the IC is connected to the externally mounted terminal in this case, it is feared that the capacitor within the IC will be electrostatically broken down by static electricity etc. impressed on the external terminal.

SUMMARY OF THE INVENTION

It is accordingly an object of this invention to provide a multistage amplifier circuit which improves the distortion factor in a high frequency region and which can provide phase compensating capacitors with low capacitances.

Another object of this invention is to provide a multistage amplifier circuit which is suited to an IC.

According to this invention, first and second capacitors are connected in series between input and output terminals of one amplifier circuit constituting a multistage amplifier circuit, and a resistor is connected between an output terminal of an amplifier circuit succeeding to the one amplifier and a common juncture of the first and second capacitors. In this manner, the first capacitor and the resistor are connected in series between the input terminal of the one amplifier and the output terminal of the succeeding amplifier circuit.

PREFERRED EMBODIMENT OF THE INVENTION

Figure 1:
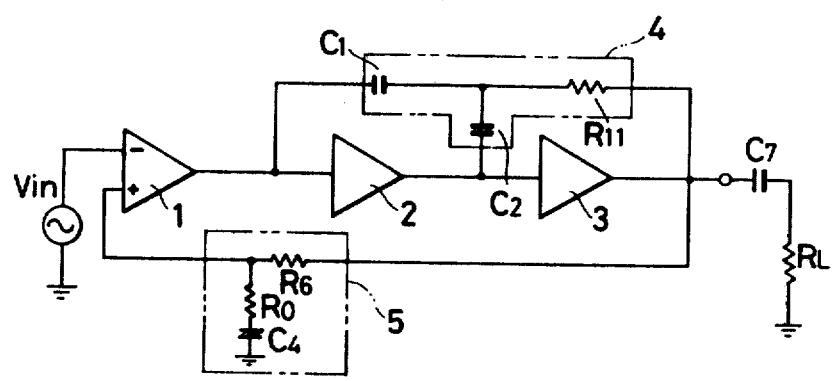
FIG. 1 is a block diagram showing an embodiment of this invention.

A multistage amplifier circuit shown in FIG. 1 is made up of amplifier circuits 1 to 3 connected in cascade, a phase compensator circuit 4, and a negative feedback circuit 5.

In, for example, a multistage amplifier circuit which is employed in a power IC for acoustic equipment, the amplifier circuit 1 is a first stage amplifier circuit for converting a voltage signal into a current signal, the amplifier circuit 2 is a driving stage amplifier circuit, and the amplifier circuit 3 is an output stage amplifier circuit. The phase compensator circuit 4 is composed of phase correcting capacitors $C_1$ and $C_2$ which are connected in series between the input and output of the driving stage amplifier circuit 2, and a resistor $R_{11}$ which is connected between the juncture of the capacitors $C_1$ and $C_2$ and the output of the output stage amplifier circuit 3.

In the above circuit, in a comparatively low frequency region, the impedance of the capacitor $C_2$ is high relative to the resistance of the resistor $R_{11}$, so that the phase compensation is executed substantially by a series circuit consisting of the capacitor $C_1$ and the resistor $R_{11}$. In a comparatively high frequency region, the impedance of the capacitor $C_2$ becomes low relative to the resistance of the resistor $R_{11}$, so that the phase compensation is effected through a series circuit consisting of the capacitors $C_1$ and $C_2$.

In the multistage amplifier circuit, since the phase compensation is done substantially by the series path of the capacitors $C_1$ and $C_2$ in the comparatively high frequency region as described above, the quantity of signal feedback from the output stage amplifier circuit 3 to the driving stage amplifier circuit 2 decreases relatively. The quantity of phase lag of the signal in the driving stage amplifier circuit 2 is smaller than the composite quantity of phase lags in the driving stage amplifier circuit and the output stage amplifier circuit. Therefore, oscillations in a circuit loop which consists of the driving stage amplifier circuit 2, the output stage amplifier circuit 3 and the phase compensator circuit 4 can be prevented. As a result, a stable phase-compensating operation is carried out according to the above circuit.

In the comparatively low frequency region, the series circuit consisting of the resistor $R_{11}$ and the capacitor $C_1$ constructs the local feedback loop between the input of the amplifier circuit 2 and the output of the amplifier circuit 3. In the low frequency region, the negative feedback is applied to the output stage amplifier by the local feedback loop, so that a gain loss due to the phase correction serves to improve upon distortion.

Although the capacitances of the capacitors $C_1$ and $C_2$ vary depending on the manner in which a cutoff frequency which is determined by the resistor $R_{11}$ is selected, they may be approximately 5-10 pF when constructing ordinary power IC's.

For this reason, when the multistage amplifier circuit is to be formed into a semiconductor integrated circuit, both the capacitors $C_1$ and $C_2$ can be contained therein.

Accordingly, the multistage amplifier circuit of this embodiment improves the distortion factor and is also suited to the form of the semiconductor integrated circuit.

Figure 2:
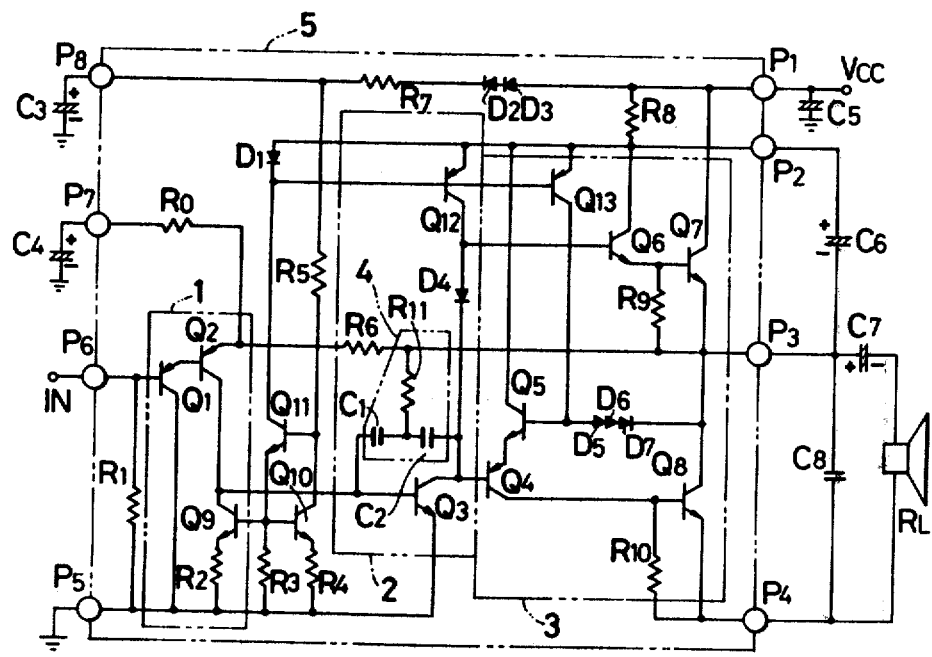
FIG. 2 is a schematic circuit diagram of the embodiment.

FIG. 2 shows an example of a circuit in which this invention is applied to an audio power IC.

A circuit 1 enclosed in a broken line is a first stage amplifier circuit, which is composed of amplifying transistors $Q_1$ and $Q_2$, a constant-current transistor $Q_9$ and a resistor $R_2$. A circuit 2 enclosed in a broken line is a driving stage amplifier circuit, which is composed of an amplifying transistor $Q_3$, a transistor $Q_{12}$ constituting a collector constant-current load, and a biasing diode $D_4$. A circuit 3 enclosed in a broken line is an output stage amplifier circuit, which is composed of transistors of pushpull operations $Q_4$-$Q_8$, a constant-current transistor $Q_{13}$, diodes $D_5$-$D_7$ and resistors $R_8$-$R_{10}$.

Shown at 4 is a phase compensator circuit, which is composed of capacitors $C_1$ and $C_2$ and a resistor $R_{11}$. The capacitors $C_1$ and $C_2$ are connected in series between the base and the collector of the amplifying transistor $Q_3$ which constitutes the driving stage amplifier circuit 2. The resistor $R_{11}$ is incorporated between the common juncture of the capacitors and the output point of the output stage amplifier circuit 3.

A negative feedback circuit is constructed of a resistor $R_6$ which is incorporated between the output terminal P3 of the output stage amplifier circuit 3 and the emitter of the transistor $Q_2$ of the first stage amplifier circuit 1, and a resistor $R_0$ and a d.c. blocking capacitor $C_4$ which are connected in series between the emitter of the transistor $Q_2$ and the earth point of the circuit. The capacitor $C_4$ has a sufficiently high capacitance. In consequence, the gain of the circuit is determined by the ratio between the resistances $R_6$ and $R_0$ in the state in which the negative feedback is applied.

The capacitor $C_6$ is one for bootstrap.

Transistors $Q_{10}$ and $Q_{11}$, diodes $D_1$-$D_3$, resistors $R_3$-$R_5$ and $R_7$ and a capacitor $C_3$ constitute circuits for supplying bias voltages to the transistors $Q_9$, $Q_{12}$ and $Q_{13}$.

Since the phase compensator circuit 4 can have the capacitances of the capacitors $C_1$ and $C_2$ made as small as approximately 5–10 pF as described previously, it can be formed within a semiconductor integrated circuit 5 indicated by a one-dot chain line. For this reason, when the multistage amplifier circuit is to be constructed into a semiconductor integrated circuit, external terminals can be omitted while achieving the improvement of the distortion factor.

This invention is not restricted to the foregoing embodiment, and is extensively applicable to an operational amplifier circuit etc. besides the audio power IC as the multistage amplifier circuit.

I claim:

1. In a multistage amplifier circuit having a plurality of amplifier circuits which are connected in cascade, and a negative feedback circuit which constitutes a closed circuit loop together with the cascade-connected amplifier circuits, said multistage amplifier circuit comprising a phase compensator circuit including first and second capacitors which are connected in series between input and output terminals of one of the plurality of amplifier circuits, and a resistor which is connected between a common juncture of the two capacitors and an output terminal of the amplifier circuit at a stage succeeding to said one amplifier, an input terminal of the succeeding-stage amplifier circuit being connected to the output terminal of said one amplifier circuit.

2. In a multistage amplifier circuit having a first stage amplifier circuit, a driving stage amplifier circuit and an output stage amplifier circuit which are connected in cascade, and a negative feedback circuit which is connected between an output terminal of the output stage amplifier circuit and a feedback input terminal of the input stage amplifier circuit, said multistage amplifier circuit comprising a phase compensator circuit including first and second capacitors which are connected in series between input and output terminals of the driving stage amplifier circuit, and a resistor which is connected between a common juncture of said first and second capacitors and the output terminal of said output stage amplifier circuit.

3. A multistage amplifier circuit according to claim 2, wherein said first stage amplifier circuit, said driving stage amplifier circuit, said output stage amplifier circuit and said phase compensator circuit are put into the form of a semiconductor integrated circuit.

4. A multistage amplifier circuit according to claim 3, wherein said output stage amplifier circuit is constructed of push-pull transistors of the class-B operation.

5. A multistage amplifier circuit according to claim 3, wherein said input stage amplifier circuit is constructed so as to deliver a current signal as an output in response to an input voltage signal received at the input terminal thereof.

* * * * *